United States Patent
Kawamoto et al.

(10) Patent No.: US 6,998,532 B2
(45) Date of Patent: Feb. 14, 2006

(54) ELECTRONIC COMPONENT-BUILT-IN MODULE

(75) Inventors: Eiji Kawamoto, Ibaraki (JP); Masaaki Hayama, Nara (JP); Masaaki Katsumata, Hirakata (JP); Hiroki Yabe, Moriguchi (JP)

(73) Assignee: Matsushita Electric Industrial Co., Ltd., Osaka (JP)

( * ) Notice: Subject to any disclaimer, the term of this patent is extended or adjusted under 35 U.S.C. 154(b) by 0 days.

(21) Appl. No.: 10/500,539

(22) PCT Filed: Dec. 22, 2003

(86) PCT No.: PCT/JP03/16427

§ 371 (c)(1),
(2), (4) Date: Jul. 1, 2004

(87) PCT Pub. No.: WO2004/060034

PCT Pub. Date: Jul. 15, 2004

(65) Prior Publication Data

US 2005/0013082 A1    Jan. 20, 2005

(30) Foreign Application Priority Data

Dec. 24, 2002   (JP)   ............................. 2002-372227
Jul. 18, 2003    (JP)   ............................. 2003-199254

(51) Int. Cl.
H01L 23/28   (2006.01)

(52) U.S. Cl. .................... 174/52.2; 174/52.4; 257/737; 257/787; 257/778

(58) Field of Classification Search ............. 174/35 R; 361/816, 818
See application file for complete search history.

(56) References Cited

U.S. PATENT DOCUMENTS 5,557,142 A * 9/1996 Gilmore et al. ............. 257/659
2001/0040290 A1 * 11/2001 Sakurai et al. ............. 257/737

FOREIGN PATENT DOCUMENTS

| JP | 07-094640 A | 4/1995 |
| JP | 11-163583 A | 6/1999 |
| JP | 2000-156429 A | 6/2000 |
| JP | 2001-024312 A | 1/2001 |
| JP | 2001-168493 A | 6/2001 |
| JP | 2001-257306 A | 9/2001 |
| JP | 2001-267473 A | 9/2001 |
| JP | 2002-110862 A | 4/2002 |
| JP | 2002-151847 A | 5/2002 |
| JP | 2002-184932 A | 6/2002 |

OTHER PUBLICATIONS

International Search Report for PCT/JP2003/016427, dated Feb. 10, 2004.

* cited by examiner

Primary Examiner—Hung V. Ngo
(74) Attorney, Agent, or Firm—RatnerPrestia

(57) ABSTRACT

A module includes an electronic component having at least two electrodes, a board having electrodes on its surface to be connected to the electrodes of the electronic component, respectively, solders for connecting the electrodes of the electronic component to the electrodes of the board, respectively, an insulating resin covering the electronic component, the surface of the board, the solder, and the electrodes, and solder resists provided on the surface of the board and around the electrodes of the board, respectively. One of the solder resists is separated from the other electrode at a portion between the electronic component and the board. When this module is mounted on a motherboard, the solder does not flow out of the electrodes even when the solder in the insulating resin melts.

23 Claims, 17 Drawing Sheets

ELECTRONIC COMPONENT-BUILT-IN MODULE

This application is a U.S. National Phase Application of PCT International Application PCT/JP2003/016427.

TECHNICAL FIELD

The present invention relates to a module accommodating an electronic component, and more particularly to a module including a wiring board, electronic components arranged on an upper surface of the board, and an insulating resin for covering the electronic components.

BACKGROUND ART

Recently, small electronic devices are widely used which devices include a module with built-in electronic components which includes a board, plural electronic components arranged on the board, and a resin mold for covering the electronic components. FIG. 17 is a sectional view of conventional module 101 with a electronic component molded with resin. Wiring board 102 has a surface having wiring pattern 111 and electrode 103 thereon, and the surface is covered with solder resist 106. Wiring board 102 has inner via 110 electrically connecting wiring pattern 112 and backside electrode 113 formed on the backside of wiring board 102. Backside electrode 113 is provided with solder 114 for connecting the electrode to a motherboard (not illustrated). Electronic component 104 and electrode 103 are connected with solder 105, and then the surface of wiring board 102 is covered with insulating resin 107 so as to wrap electronic component 104. The surface of module 101 is provided with metal-plated, electromagnetic shield layer 115 thereon.

In conventional module 101, electronic component 104 is mounted and on wiring board 102, and wired with solder and bonding wires.

The mounting with bonding wires requires a larger area than that of electronic component 104 for joining with wires, thus making the module unsuitable for reducing the size of electronic devices.

Meanwhile, The mounting with solder requires an area substantially identical to the size of the electronic component although fillet at an end of electrode 103 is needed, thus making the module suitable for reducing the size of electronic devices. However, in order to prevent short-circuit due to the solder, portions except for the electrodes on the surface of wiring board 102 are required to cover with solder resist 106. In order to prevent short-circuit between electrodes upon its mounting, a very small amount of solder is used. Therefore, clearance 107A between electronic component 104 and wiring board 102 covered with solder resist 106 after the mounting is approximately maximum 10 $\mu$m. When electronic component 104 is molded with insulating resin 107, the resin 107 does not flow into clearance 107A sufficiently, hence causing a space in the clearance.

If module 101 having the space in clearance 107A is joined to the motherboard with solder, solder 105 may melt in module 101, and the melting solder 105 flows into clearance 107A. Consequently, the solder causes short-circuiting failure between electrodes 103, hence ruining a function of module 101.

In order to fill clearance 107A between electronic component 104 and wiring board 102 with the insulating resin, the vacuum printing method is proposed. The insulating resin often contains inorganic filler, such as $SiO_2$, having a particle diameter of several dozen micrometers. Therefore, it is difficult to fill clearance 107A of approximately 10 $\mu$m with an insulating resin even by the vacuum printing method.

Clearance 107A between electronic component 104 and photo-resist 106 may be filled with underfill having a particle diameter less than 10 $\mu$m. However, such underfill is very expensive since being made of finely-classified inorganic filler.

FIG. 18 is a sectional view of another conventional module with built-in electronic components molded with an insulating resin. Wiring board 1102 has a surface having wiring pattern 1111 thereon and electrode 1103. The surface is covered with solder resist 1116. Wiring board 1102 is provided with inner via 1110 and wiring pattern 1112 therein. Wiring board 1102 is provided with backside electrode 1113 and solder 1114 on the backside electrode. Electrode 1106 of electronic component 1104 and electrode 1103 of wiring board 1102 are connected with solder 1105, and then the surface of wiring board 1102 is covered with insulating resin 1107 so as to wrap electronic component 1104. Module 1110 has metal-plated, electromagnetic shield layer 1115 thereon.

Module 1100 is mounted on a motherboard with reflow soldering. In this case, solder 1105 in module 1100 melts and has its volume expanding. The volume expansion of solder 1105 may apply a stress to electronic component 1104, so that the stress will tear electronic component 1104 from portion 1107A of insulating resin 1107 intervening between electronic component 1104 and wiring board 1102. Consequently, solder 1105 may flow out between electronic component 1104 and insulating resin 1107, hence causing short-circuiting between electrodes 1103.

Conventional modules similar to above-mentioned ones are disclosed in Japanese Patent Laid-Open Publication Nos.2001-24312, 11-163583, and 2001-168493.

SUMMERY OF THE INVENTION

A module includes an electronic component having at least two electrodes, a board having electrodes on its surface to be connected to the electrodes of the electronic component, respectively, solders for connecting the electrodes of the electronic component to the electrodes of the board, respectively, an insulating resin covering the electronic component, the surface of the board, the solder, and the electrodes, and solder resists provided on the surface of the board and around the electrodes of the board, respectively. One of the solder resists is separated from the other electrode at a portion between the electronic component and the board.

When this module is mounted on a motherboard, the solder does not flow out of the electrodes even when the solder in the insulating resin melts.

DETAILED DESCRIPTION OF PREFERRED EMBODIMENTS

Exemplary Embodiment 1

Figure 1A:
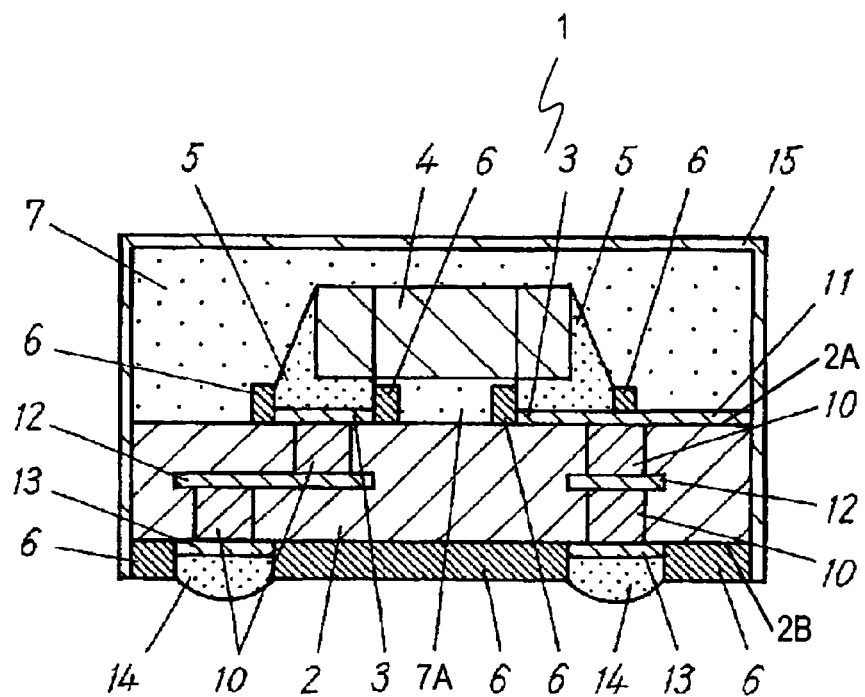
FIG. 1A is a sectional view of a module according to Exemplary Embodiment 1 of the present invention.

FIG. 1A is a sectional view of module 1 with built-in electronic component 4 accommodated therein according to Exemplary Embodiment 1 of the present invention. Multi-layered wiring board 2 includes electrode 3 and wiring pattern 11 on surface 2A, and includes wiring pattern 12 and inner via 10 inside of wiring board 2. Backside 2B has backside electrode 13 solder resist 6 thereon.

Figure 2:
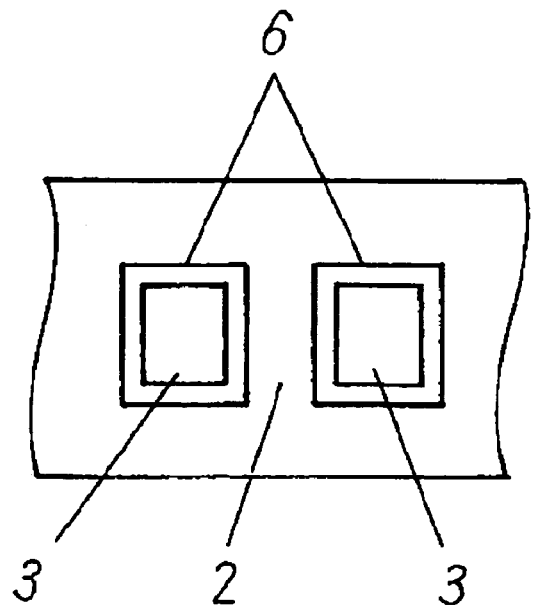
FIG. 2 is a top view of a wiring board of the module according to Embodiment 1.

FIG. 2 is a top view of two electrodes 3 to be connected to electronic component 4 and the periphery of electrodes 3 on wiring board 2. Electrode 3 on surface 2A of wiring board 2 is surrounded by solder resist 6. Solder resist 6 is formed only around electrode 3. Solder resists 6 around electrodes 3 adjacent to each other are separated from each other and are not connected to each other at the bottom of electronic component 4, hence making a sufficient clearance between electronic component 4 and wiring board 2. Consequently, the clearance between electronic component 4 and wiring board 2 is easily filled with portion 7A, a first insulating resin, of insulating resin 7. Further, insulating resin 7 and part 7A contact wiring board 2. This arrangement reduces the area of insulating resin 7 contacting solder resist 6 having low adhesion with the insulating resin, hence allowing insulating resin 7 to be bonded on wiring board 2 firmly.

Figure 3:
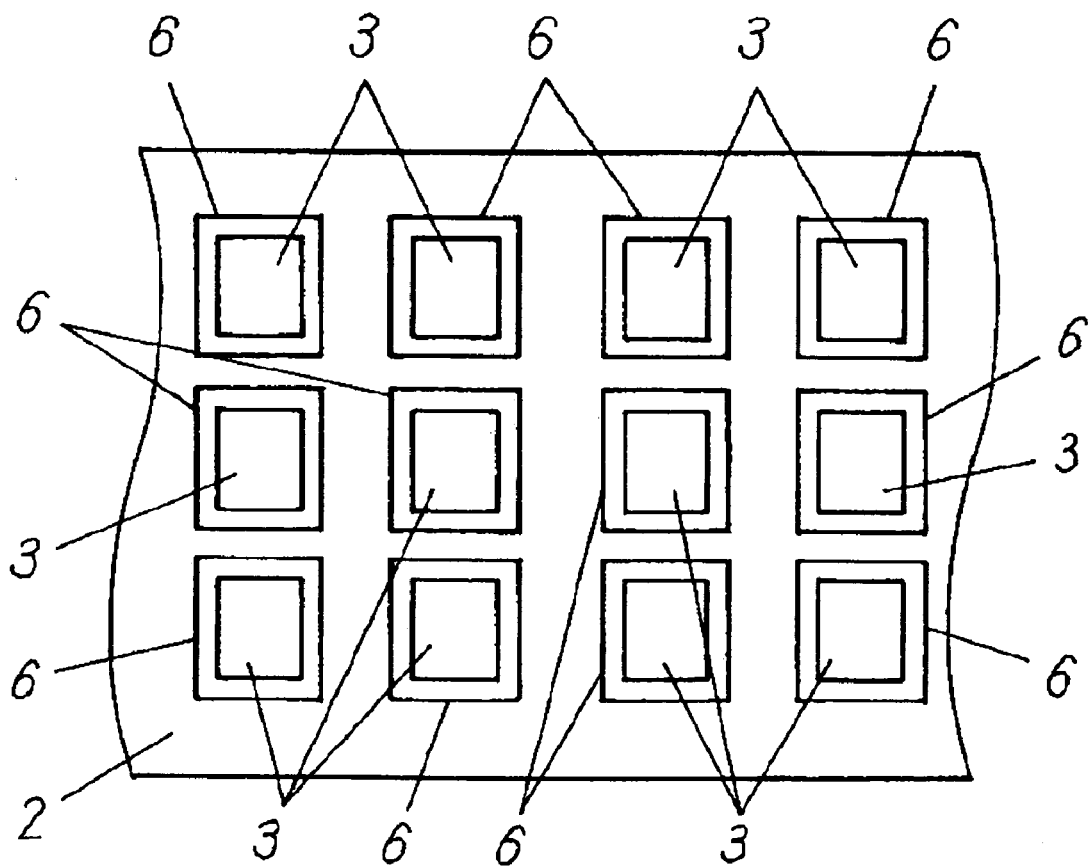
FIG. 3 is a top view of the wiring board of the module according to Embodiment 1.

FIG. 3 is a top view of electrodes 3 on wiring board 2 which are connected to plural electronic components 4 and the peripheries of electrodes 3. The portions other than bottoms of electronic components 4 are easily filled with resin 7, and thus, solder resists 6 around respective electrodes 3 to be connected to electronic components 4 adjacent to each other may be connected.

Wiring patterns 11 and 12 are made of Cu foil, however may be made of another conductive substance, such as conductive resin composition.

Inner via 10 may be made of conductive substance having a thermosetting property. The conductive substance may be conductive resin composition including mixture of metallic particles and thermosetting resin. The metallic particles may be Au, Ag, or Cu, Au, Ag, and Cu are preferable for their high conductivity, and Cu is particularly preferable since CU has a high conductivity, low migration profile and is inexpensive. The thermosetting resin may be epoxy resin, phenol resin, or cyanate resin. The epoxy resin particularly preferable for its high heat resistance.

Electronic component 4 is mounted with solder 5 on a predetermined position of wiring board 2. Electronic component 4 may be a chip-like component, such as a resistance, capacitor, and inductor, or a surface-mounting, passive component, such as an oscillator and filter.

Figure 1B:
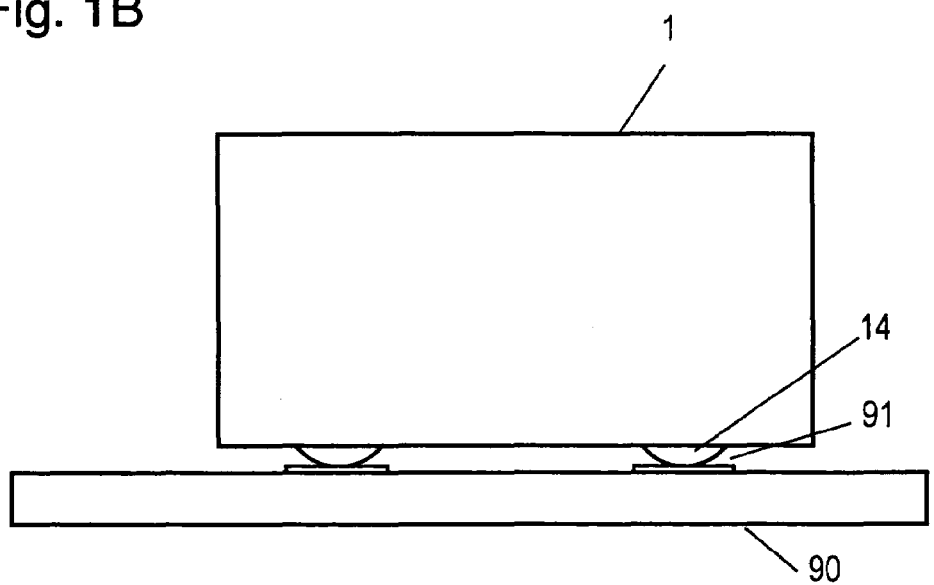
FIG. 1B illustrates the module and a motherboard having the module mounted thereon according to Embodiment 1.

FIG. 1B shows module 1 and motherboard 90 having module 1 mounted thereon. Solder 14 of module 1 is connected to electrode 91 on motherboard 90. Solder 5 may be Pb—Sn eutectic solder, and may be Pb-free solder of Sn—Ag—Cu, Au—Sn, or Sn—Zn. Solder 5 for mounting electronic component 4 may be made of material different from or identical to that of solder 14 for mounting module 1 on motherboard 90. The solders may be Pb-free solders, which are preferable for recent environmental issues.

Insulating resin 7 covering electronic component 4 completely is made of mixture of inorganic filler and thermosetting resin. The inorganic filler may be substance, such as $Al_2O_3$, MgO, BN, AlN, $SiO_2$, and $BaTiO_3$. The inorganic filler is preferably contained in resin 7 by a rate ranging from 50 wt. % to 95 wt. %. This range allows insulating resin 7 to have a wall thickness (for example, 1 mm) beyond the height of electronic component 4. If the rate of the inorganic filler is less than 50 wt %, insulating resin 7 has a large fluidity, and can not have the wall thickness more than the height of electronic component 4. Meanwhile, if insulating resin 7 containing more than 95 wt. % of the inorganic filler has a fluidity to small to completely cover electronic component 4. The particle diameter of the inorganic filler is smaller than the clearance of a portion excluding solder resist 6 between wiring board 2 and electronic component 4. The particle diameter enables the clearance between electronic component 4 and wiring board 2 to be easily filled with the insulating resin. The thermosetting, insulating resin contained in insulating resin 7 may be epoxy resin, phenol resin, or cyanate resin as the thermosetting resin, and preferably may be the epoxy resin since the epoxy resin has a high heat resistance.

Insulating resin 7 has a surface having metal film 15 provided thereon functioning as an electromagnetic shield. Metal film 15 may be made of at least one of metallic materials, such as Au, Ag, Cu, Ni, Cr, Zn, Ti, Al, and Sn.

As shown in FIG. 1A, the thickness of solder resist 6 and a lifting of electronic component 4 occurring when electronic component 4 is mounted with solder 5 creates a space having a height of approximately 50 $\mu$m between electronic component 4 and wiring board 2. The particle diameter of the inorganic filler contained in insulating resin 7 is determined to be less than 50 $\mu$m, which is a clearance between electronic component 4 and wiring board 2, and enables the clearance to be easily filled with insulating resin 7. Further, inorganic filler having a particle diameter less than 10 $\mu$m is not required, and insulating resin 7 can be formed to have a thickness (for example, 1 mm) beyond the height of electronic component 4. The inorganic filler having the large particle diameter of 50 μm is inexpensive.

Since insulating resin 7 contacts wiring board 2, the area of insulating resin 7 that contacts solder resist 6, which has a low adhesion, is small, hence allowing insulating resin 7 to be firmly bonded to wiring board 2.

The above-mentioned structure allows the clearance between electronic component 4 and wiring board 2 to be easily filled with insulating resin 7. The structure allows insulating resin 7 to functions as a wall for preventing solder 5 from flowing out even if solder 5 melts when module 1 is mounted on motherboard 90, hence preventing a short-circuiting between electrodes 3.

The insulating resin 7 has a bending modulus preferably less than 20 GPa. In the case that the modulus is more than 20 GPa, when a stress caused by the volume expansion caused by the melting of solder 5 is applied to insulating resin 7, a stress to suppress the volume expansion of solder 5 also occurs. These stresses do not balance with each other, hence resulting in a crack in insulating resin 7. Then, melting solder 5 flows into the crack, hence causing the characteristic of module 1 to deteriorate. Insulating resin 7 having a bending modulus less than 20 GPa can deform according to the volume expansion caused by the melting of solder 5. Accordingly, insulating resin 7 does not have the crack generated therein, hence preventing melting solder 5 to flow into it. Therefore, module 1 does not have short-circuit trouble due to the solder and has characteristics not deteriorate.

Exemplary Embodiment 2

Figure 4:
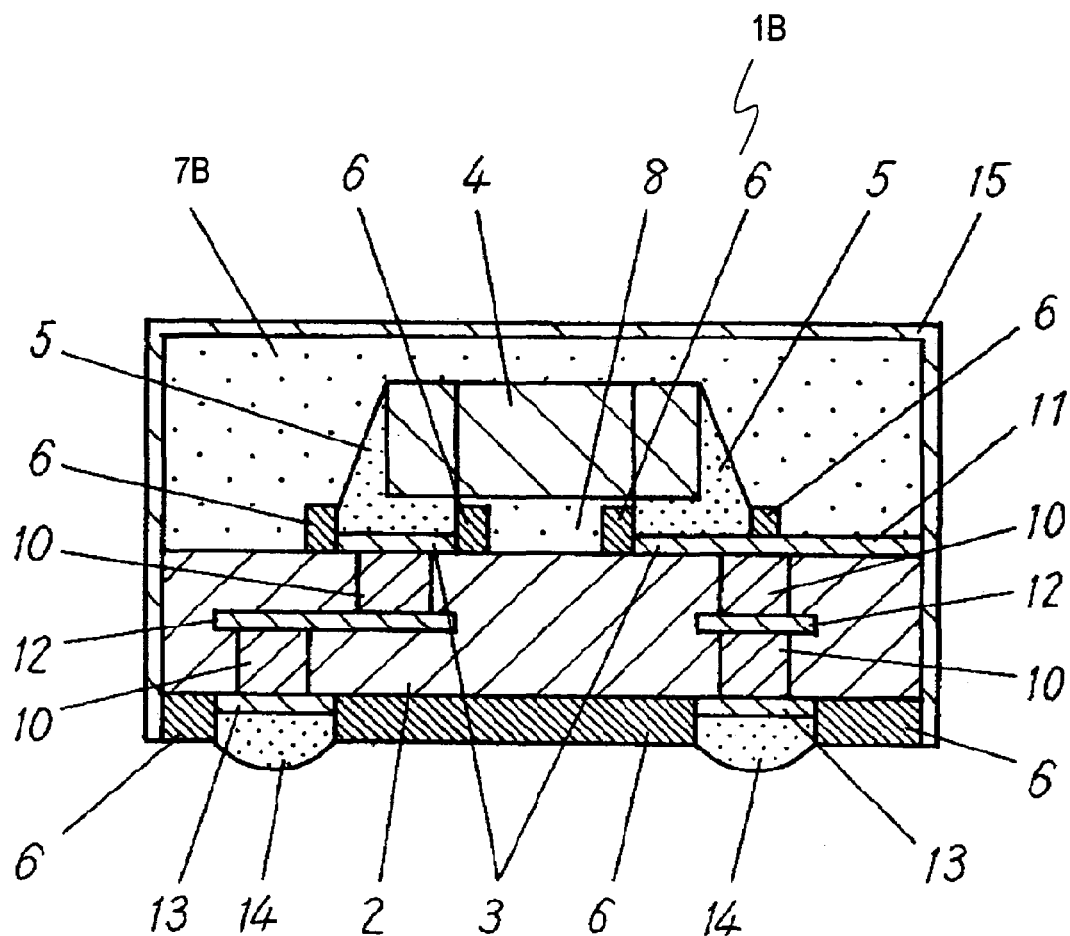
FIG. 4 is a sectional view of a module according to Exemplary Embodiment 2 of the invention.

FIG. 4 is a sectional view of module 1B with built-in electronic component 4 according to Exemplary Embodiment 2 of the present invention. The same elements as those of Embodiment 1 are denoted by the same reference numerals and are not described in detail. Insulating resin 7B is formed around electronic component 4 and is made of material similar to that of insulating resin 7 shown in FIG. 1A according to Embodiment 1. As shown in FIG. 4, similarly to Embodiment 1, solder resist 6 is formed only around electrode 3, hence providing a large clearance between electronic component 4 and wiring board. The clearance between electronic component 4 and wiring board 2 is filled with insulating resin 8, and then, electronic component 4, insulating resin 8, and insulating resin 7B for covering wiring board 2 are provided. Then, metal film 15 functioning as an electromagnetic shield is formed on the surface of insulating resin 7B.

Insulating resin 8 is made of mixture containing inorganic filler and thermosetting resin. The inorganic filler may be substance, such as $Al_2O_3$, MgO, BN, AlN, $SiO_2$, and $BaTiO_3$. The inorganic filler is contained by a rate ranging from 10 wt. % to 70 wt. % in insulating resin 8. Insulating resin 8 is required to have a high fluidity enough to fill the clearance between electronic component 4 and wiring board 2. Insulating resin 8 does not necessarily have a thick portion on the outer surface of electronic component 4, which is differently from insulating resin 7B, and hence, includes the inorganic filler by the rate smaller than that of insulating resin 7B. In other words, a first insulating resin of module 1 according to Embodiment 1 shown in FIG. 1 corresponds to insulating resin 8 and insulating resin 7B, which are second and third insulating resins, respectively, in module 1B shown in FIG. 4 according to Embodiment 2. Insulating resin 7B is positioned at a side of electronic component 4 opposite to board 2.

Insulating resin 8 functions as a wall between electronic component 4 and wiring board 2 for preventing solder from flowing out when solder 5 melts. If insulating resin 8 does not contain inorganic filler at all, the resin has a very high fluidity, hence allowing solder 5 to easily flow out, that is, hence preventing insulating resin 8 from functioning as the wall. Therefore, insulating resin 8 needs to contain inorganic filler. In consideration of the wall function and the fluidity, inorganic filler is contained insulating resin 8 preferably by a rate ranging from 10 wt. % to 70 wt. %. This rate allows the clearance between electronic component 4 and wiring board 2 to be easily filled with insulating resin 8.

Similarly to Embodiment 1, since contacting wiring board 2, insulating resin 8 is bonded to wiring board 2 firmly.

Similarly to insulating resin 7B, insulating resin 8 preferably has a bending modulus less than 20 GPa. If insulating resin 8 is made of material with a bending modulus more than 20 GPa, two types of stresses are applied to insulating resin 8: a stress caused by a volume expansion due to melting of solder 5, and a stress preventing the volume expansion of solder 5. These stresses do not balance each other, and insulating resin 8 has a crack generated therein, hence allowing melting solder 5 to flow into the crack and having characteristics of module 1A to deteriorate. Insulating resin 8 having a bending modulus less than 20 GPa deforms according to the volume expansion due to the melting of solder 5. Consequently, insulating resin 8 does not have a crack formed therein, hence preventing melting solder 5 from flowing out. This prevents short-circuiting due to the solder, and prevents the characteristics of module 1A from deteriorating.

Exemplary Embodiment 3

Figure 5:
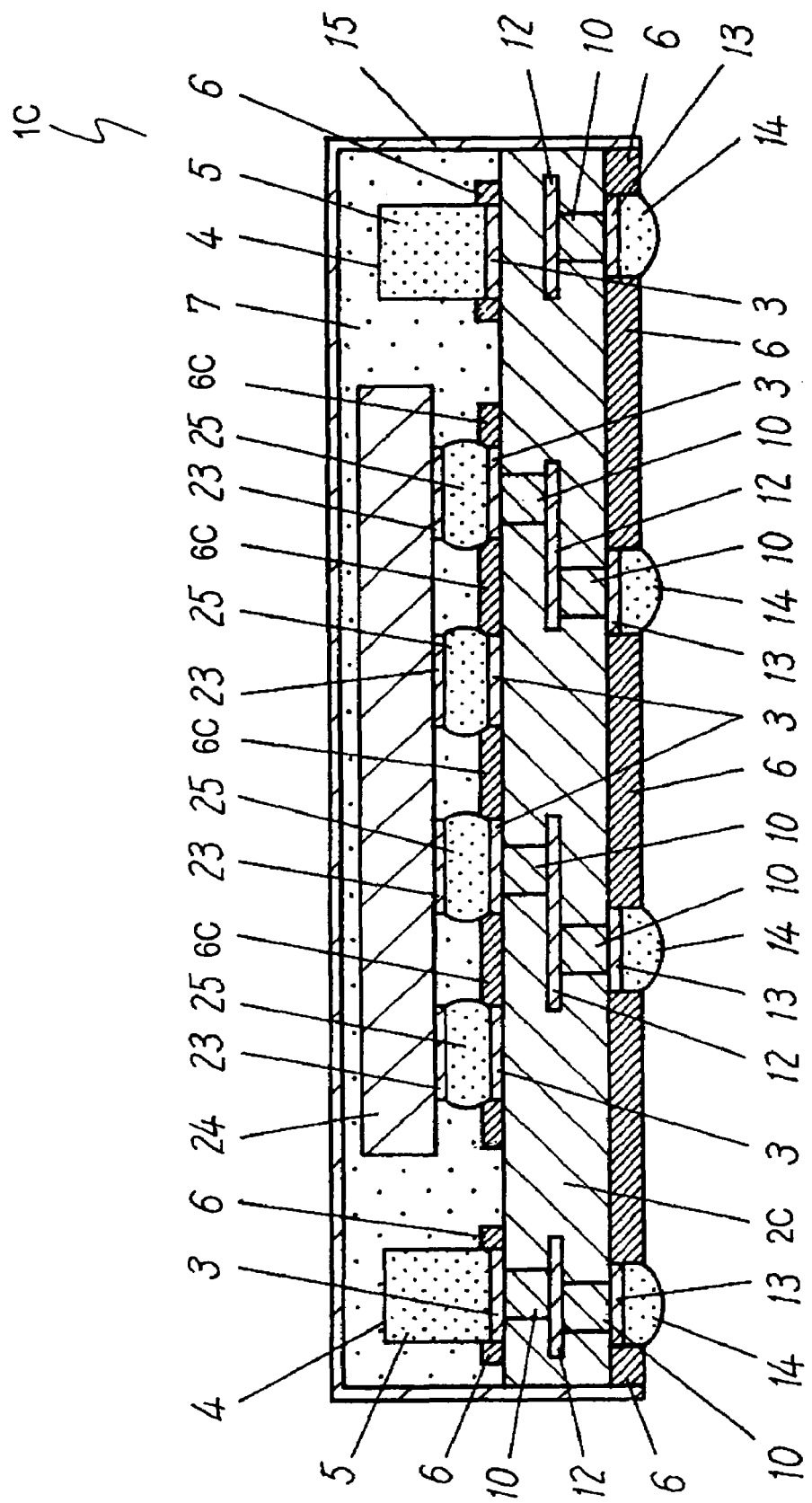
FIG. 5 is a sectional view of a module according to Exemplary Embodiment 3 of the invention.
Figure 6:
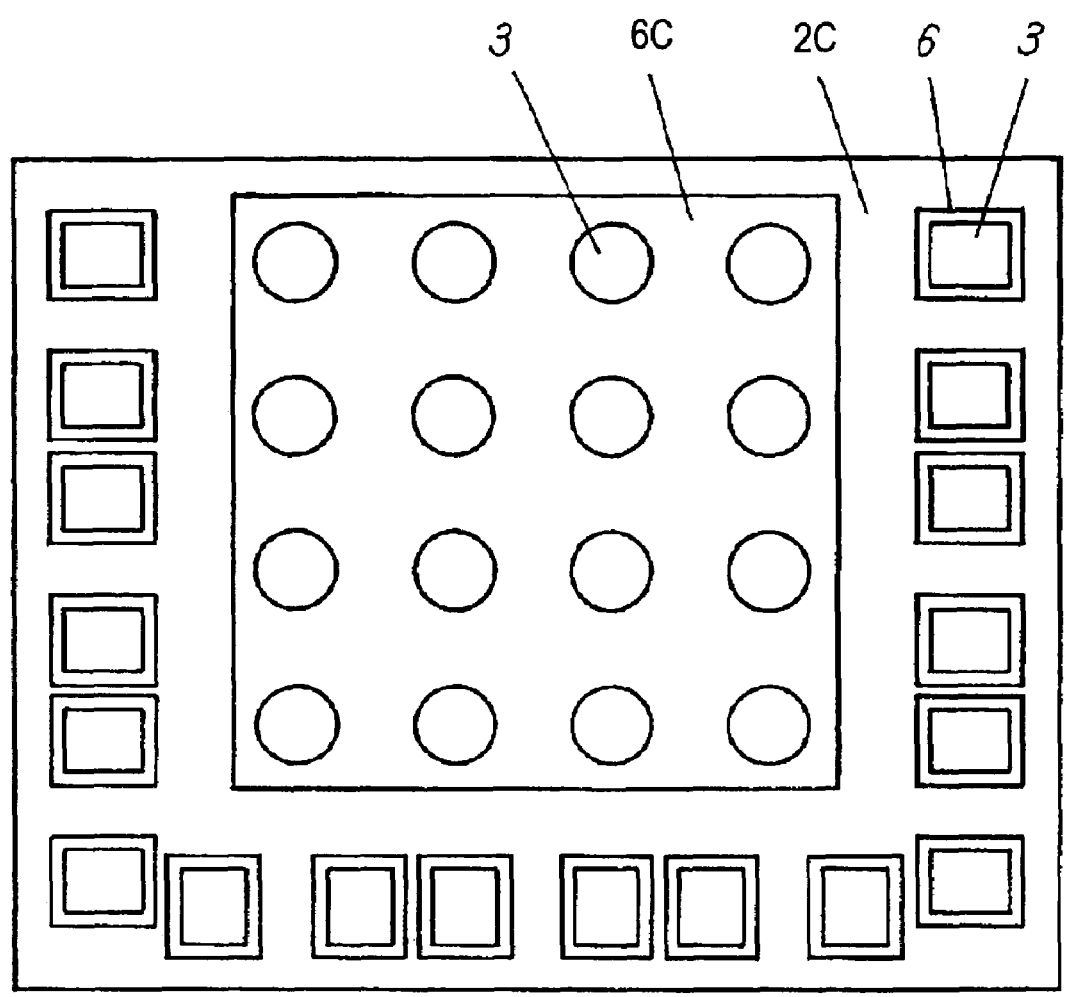
FIG. 6 is a top view of a wiring board of the module according to Embodiment 3.
Figure 7:
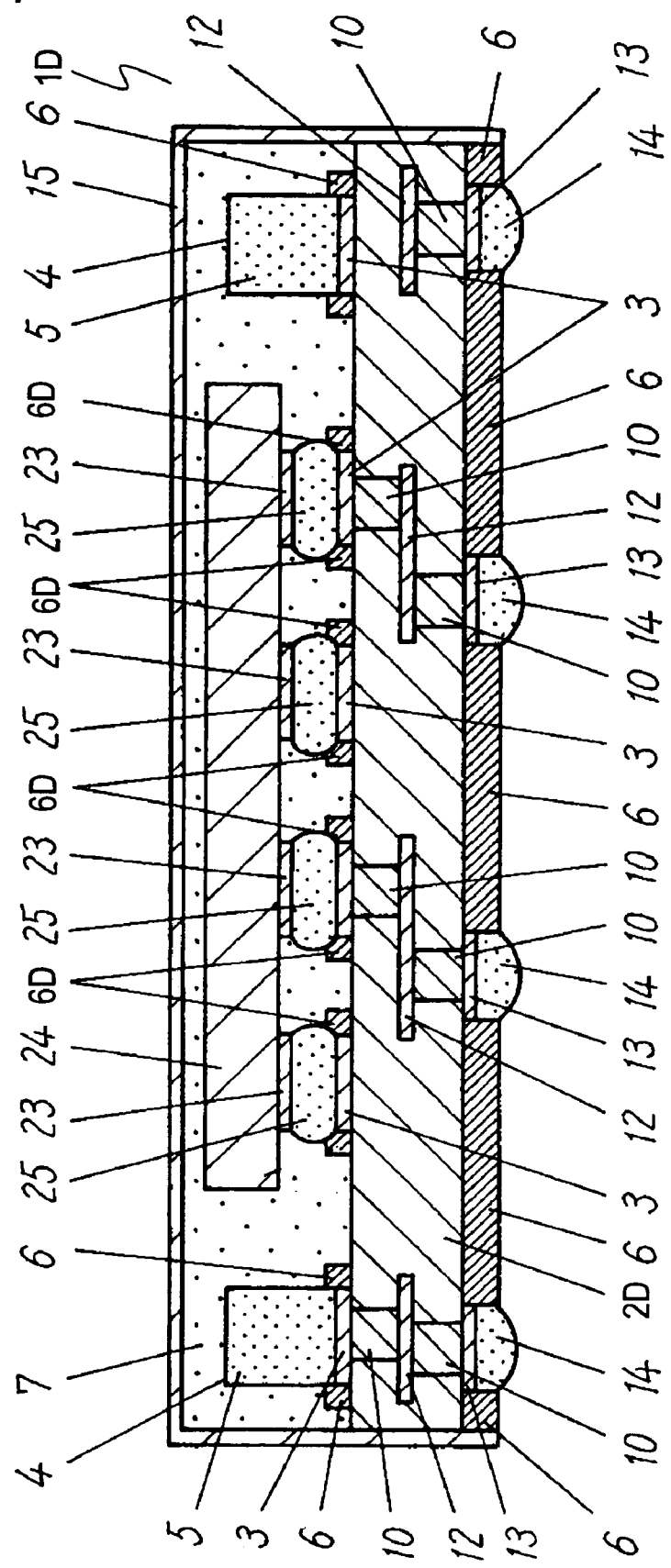
FIG. 7 is a sectional view of the module according to Embodiment 3.
Figure 8:
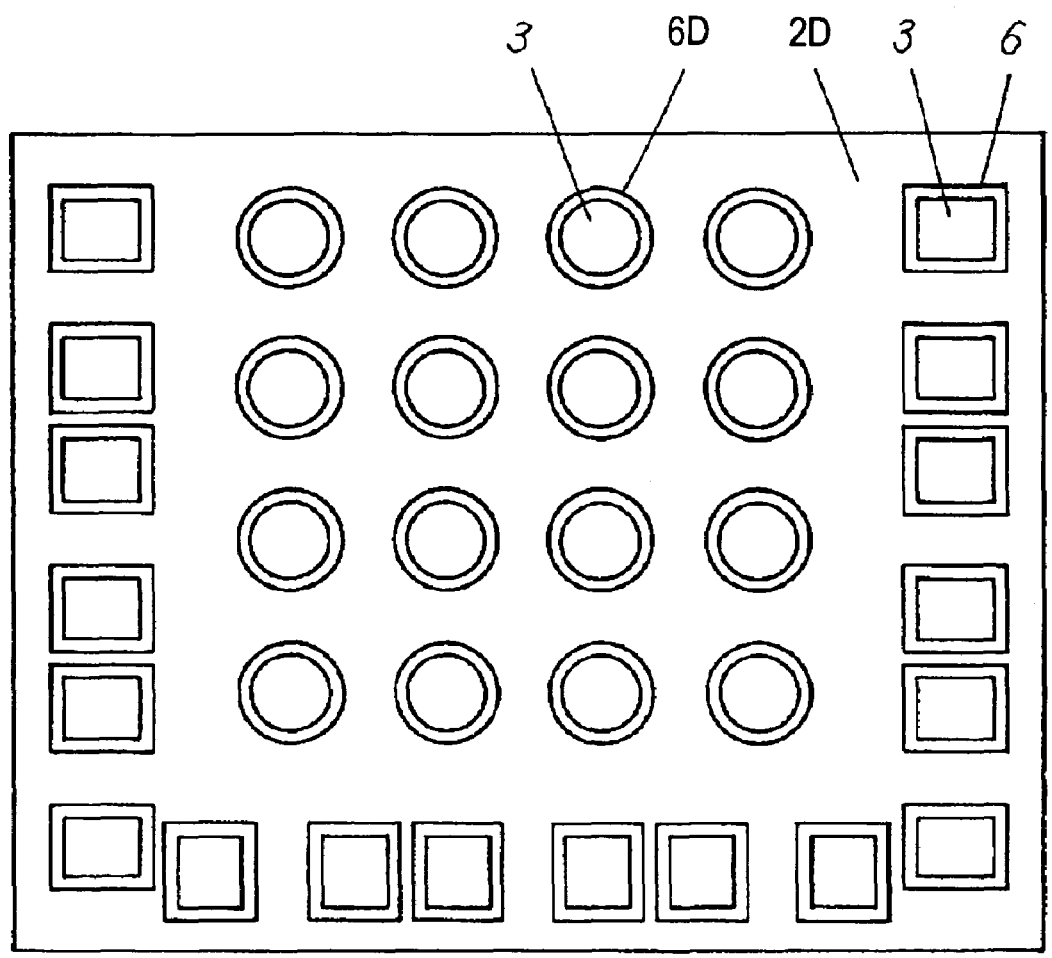
FIG. 8 is a top view of the wiring board of the module according to Embodiment 3.

FIG. 5 is a sectional view of module 1C with the built-in electronic component according to Exemplary Embodiment 3 of the present invention. FIG. 6 is a top view of wiring board 2C of module 1C according to Embodiment 3. FIG. 7 is a sectional view of another module 1D according to Embodiment 3, and FIG. 8 is a top view of wiring board 2D of module 1D according to Embodiment 3. The same elements as those of Embodiment 1 are denoted by the same reference numerals and are not described detail.

As shown in FIGS. 5 and 6, similarly to Embodiment 1, in module 1C, solder resists 6 and 6C are formed only around electrodes 3 on the surface of wiring board 2C. Electronic component 4 is mounted with solder 5, and electronic component 24 is mounted with solder 25.

Electronic component 24 is a surface-mounted, active component including a semiconductor device, such as a transistor, IC, and LSI. Similarly to Embodiment 1, insulating resin 7 having a height more than heights of electronic components 4 and 24 is provided. A clearance between electronic component 24 and wiring board 2 is determined to be more than a clearance between wiring board 2 and electronic component 4, a passive component. Electrode 23 of electronic component 24 is positioned on a surface of component 24 facing board 2C, and does not have a fillet of solder 5 formed thereon, unlike electronic component 4. Consequently, solder 25 spreads the clearance between electronic component 24 and wiring board 2 like a column. This structure allows the surface of wiring board 2 over which electronic component 24 is positioned to be covered with solder resist 6C except a position where electrode 23 is mounted. Another module 1D shown in FIGS. 7 and 8 includes solder resist 6D only around electrode 3 to have electronic component 24 mounted thereon.

Modules 1C and 1D can incorporate both active component 24 and passive component 4, hence accomplishing a number of functions.

Exemplary Embodiment 4

Figure 9:
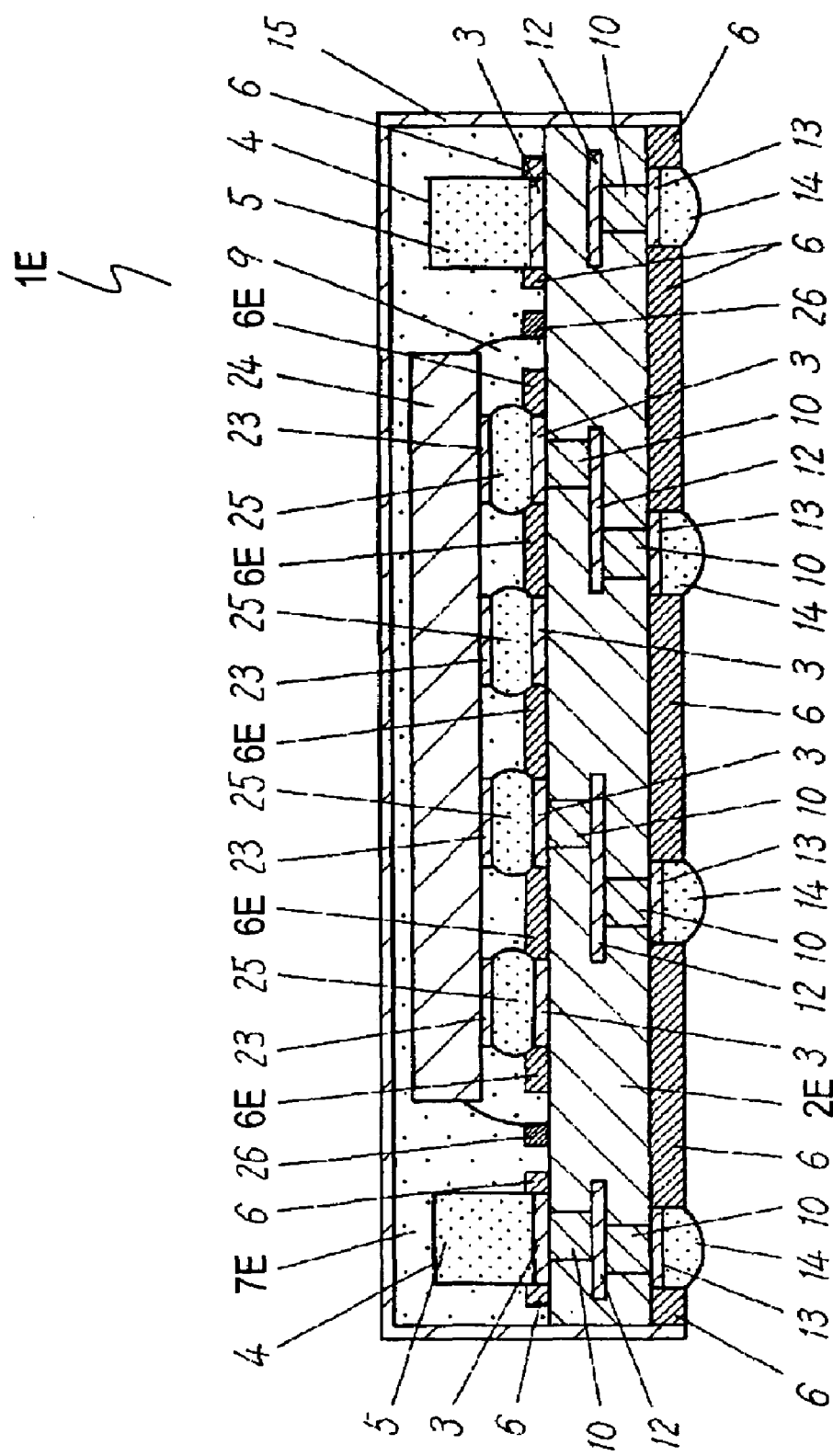
FIG. 9 is a sectional view of a module according to Exemplary Embodiment 4 of the invention.
Figure 10:
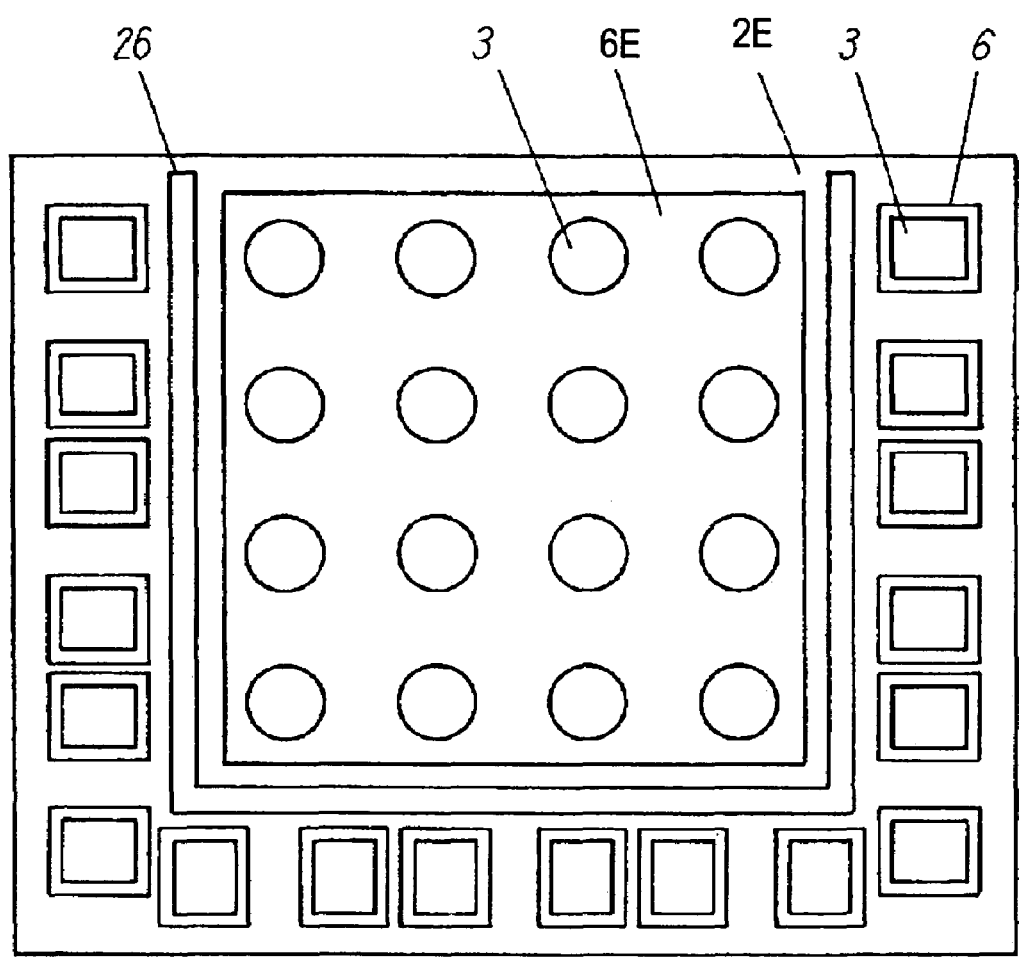
FIG. 10 is a top view of a wiring board of the module according to Embodiment 4.
Figure 11:
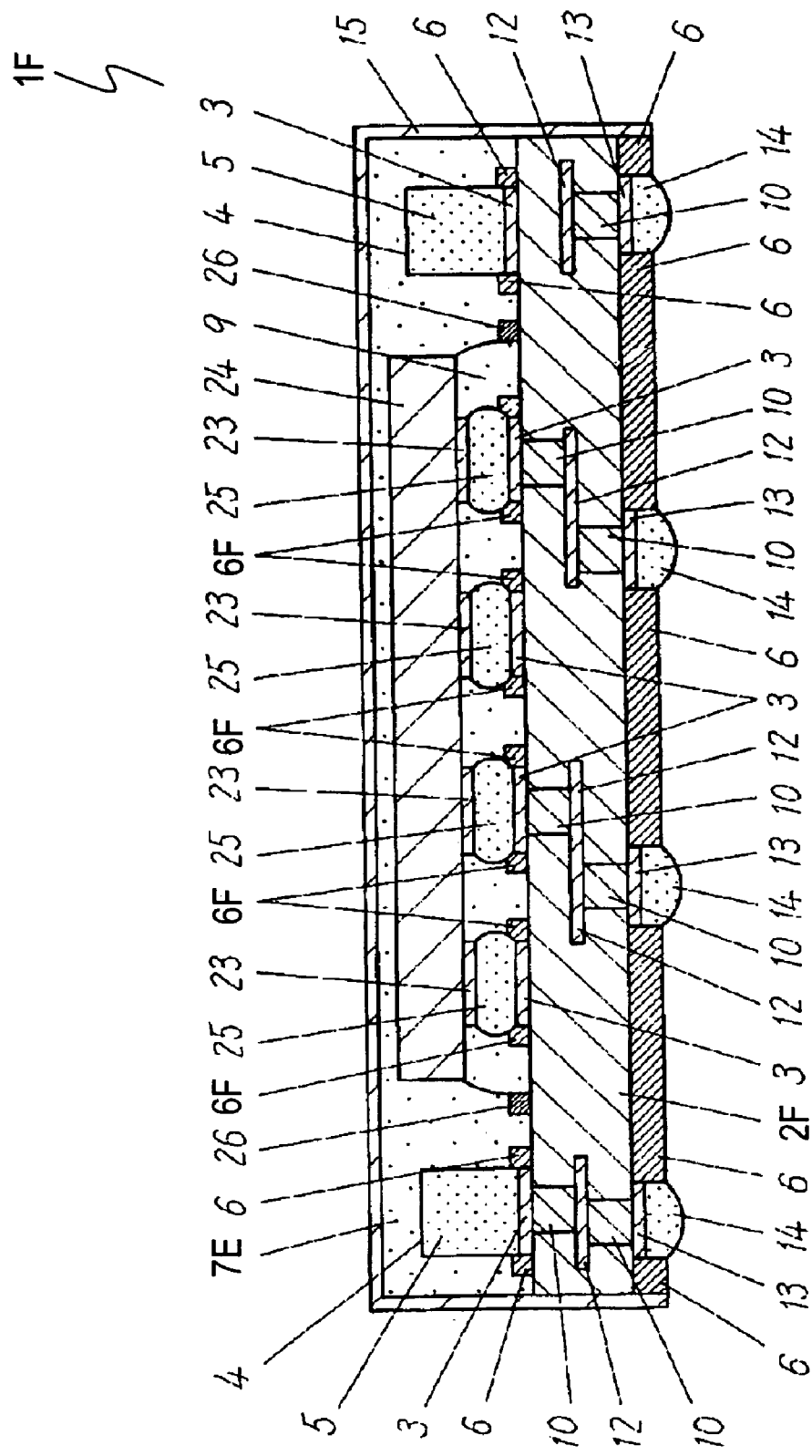
FIG. 11 is a sectional view of the module according to Embodiment 4.
Figure 12:
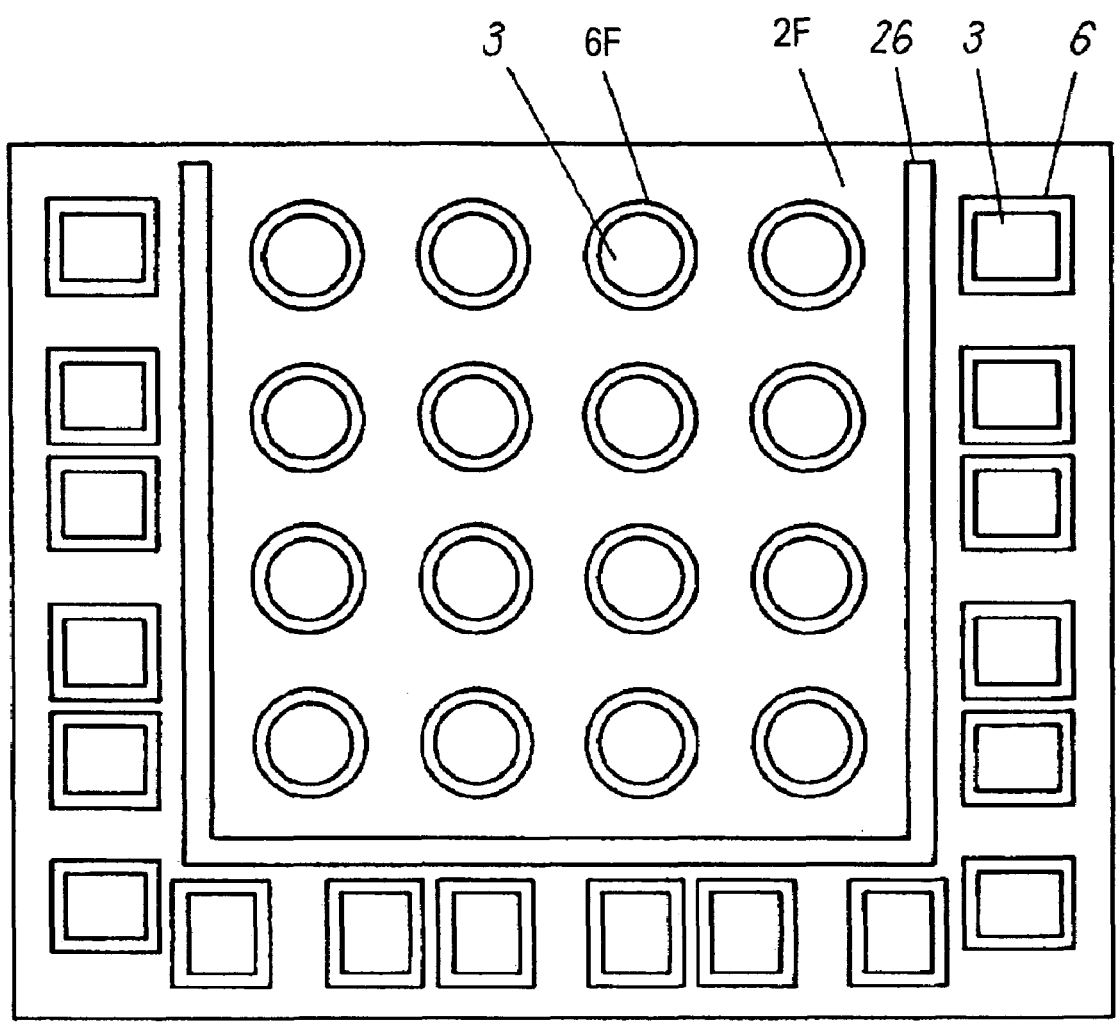
FIG. 12 is a top view of a wiring board of the module according to Embodiment 4.

FIG. 9 is a sectional view of module 1E with a built-in electronic component according to exemplary Embodiment 4 of the present invention, and FIG. 10 is a top view of wiring board 2E of module 1E. FIG. 11 is a sectional view of another module 1F according to Embodiment 4, and FIG. 12 is a top view of wiring board 2F of module 1F. The same elements as those of Embodiments 1 to 3 are denoted by the same reference numerals and are not described in detail.

An area of electronic component 24, an active component, is larger than that of electronic component 4, so that the difference in thermal expansion coefficients between electronic component 24 and wiring board 2 tends to cause a connection defect. As shown in FIG. 9, in order to reduce the difference of thermal expansion coefficients, the clearance between electronic component 24 and wiring board 2 is filled with insulating resin 9 having a thermal expansion coefficient larger than those of electronic component 24 and wiring board 2.

Electronic component 4 has a solder fillet. If the clearance between electronic component 4 and wiring board 2 is filled with insulating resin 9 having a large thermal expansion coefficient, a temperature of module 1E reaches a temperature higher than the melting point of solder when module 1E is mounted on a motherboard by reflow soldering. Consequently, according to expansion of insulating resin 9, solder 5 is torn apart from electrode 3 on wiring board 2. Then, solder 5 is cooled below the melting point, and has its volume contract. However, the volume expansion of insulating resin 9 is still large, hence allowing solder 5 to be solidified and to be separated from electrode 3. Namely, the reflow soldering causes a break between solder 5 and electrode 3, and the break prevents the clearance between electronic component 4 and wiring board 2 from being filled with insulating resin 9.

As shown in FIGS. 9 and 10, electronic component 4 is covered with insulating resin 7 having a thermal expansion coefficient smaller than that of insulating resin 9. In order to control a portion coated with insulating resin 9, solder resist 26 to be a wall for preventing insulating resin 9 from flowing out is formed between electronic component 24 and electronic component 4.

According to Embodiment 4, similarly to embodiment 3, the surface of wiring board 2 where electronic component 24 is mounted may be covered with solder resist 6E, excluding a portion for electrode 3. In module 1F shown in FIGS. 11 and 12, the surface of wiring board 24 where electronic component 24 is mounted has solder resist 6F thereon only around electrode 3.

Modules 1E and 1F can incorporate both active component 24 and passive component 4, hence accomplishing a number of functions.

Exemplary Embodiment 5

Figure 13A:
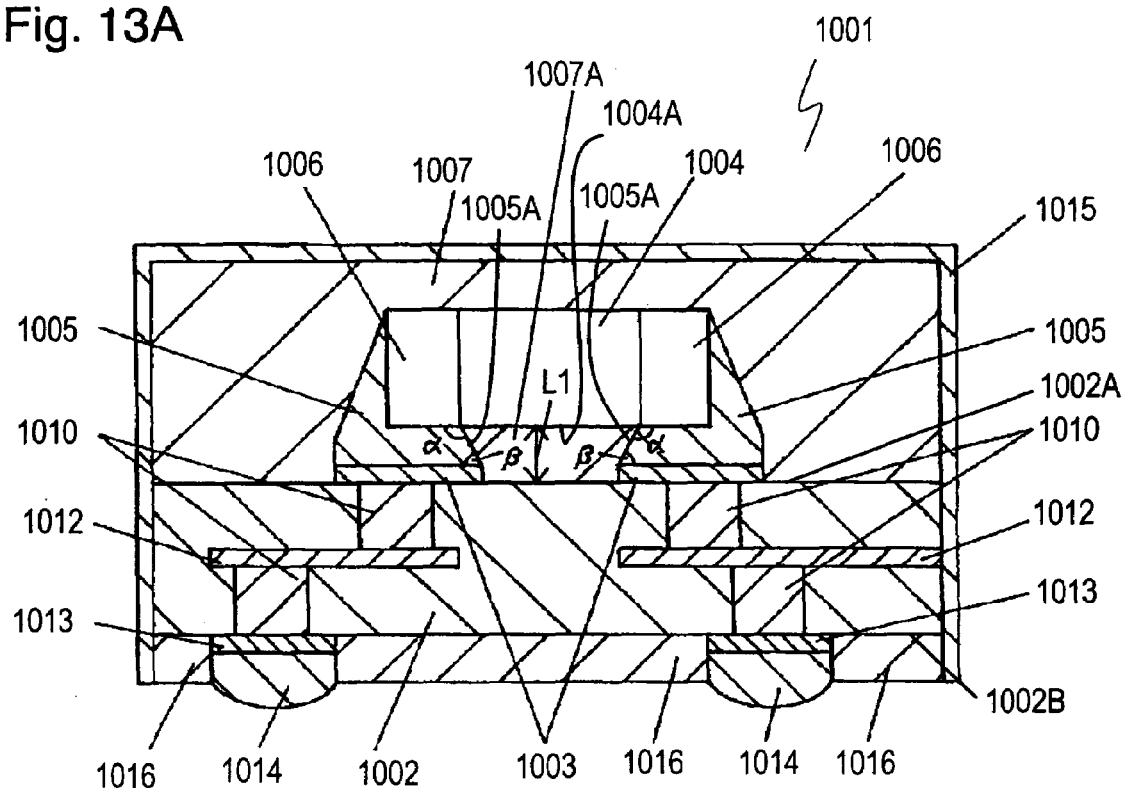
FIG. 13A is a sectional view of a module according to Exemplary Embodiment 5 of the invention.
Figure 14A:
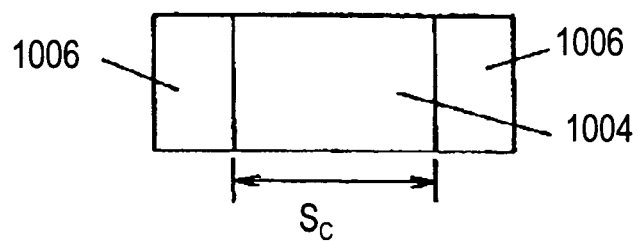
FIG. 14A is a front view of an electronic component in modules according to Embodiments 5 to 7.
Figure 14B:
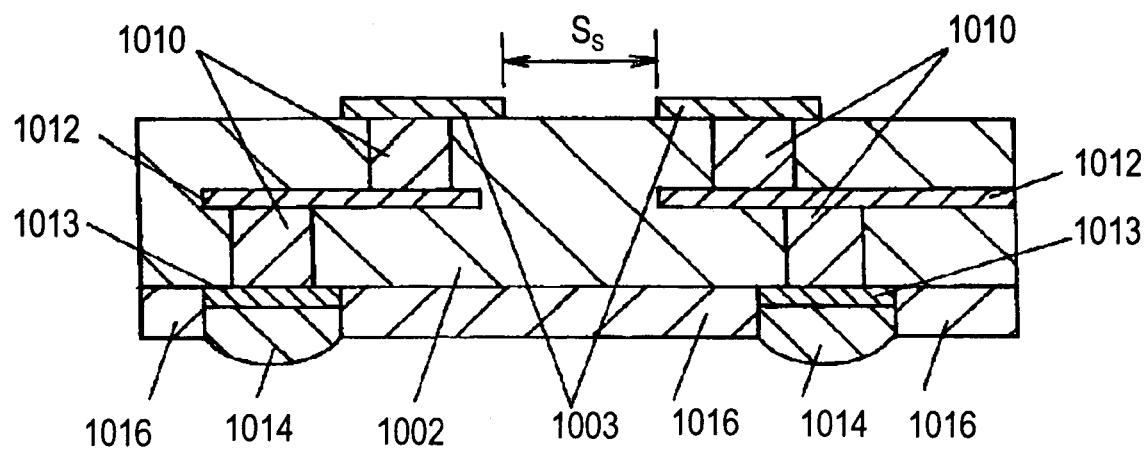
FIG. 14B is a sectional view of a wiring board of the modules according to Embodiments 5 through 7.

FIG. 13A is a sectional view of module 1001 with built-in electronic component 1004 according to Exemplary Embodiment 5 of the present invention. FIG. 14A illustrates electronic component 1004. FIG. 14B illustrates electrode 1003 on wiring board 1002 incorporated in module 1001.

Multi-layered wiring board 1002 includes electrode 1003 and wiring pattern 1012 on surface 1002A, inner via 1010 in the inner layer, and backside electrode 1013 on backside 1002B. Solder 1014 is provided on backside electrode 1013, and solder resist 1016 for surrounding solder 1014 is provided on backside 1002B of wiring board 1002. Electrodes 1003 and 1013, and wiring pattern 1012 are made of Cu foil, and alternatively, may be made of another conductive substance, such as conductive resin composition. Inner via 1010 is made of conductive substance having a thermosetting property, such as conductive resin composition of mixture of metallic particles and thermosetting resin. The metallic particles may preferably be Au, Ag, or Cu for their high conductivities, and particularly, may more preferably be Cu since Cu has a high conductivity and low migration, and is inexpensive. The thermosetting resin may preferably be epoxy resin, phenol resin, or cyanate resin, and particularly, may more preferably br epoxy resin for its high heat resistance.

Electronic component 1004 having electrodes 1006 on both ends thereof is mounted on wiring board 1002 with solder 1005. Electronic component 1004 may be an active component, such as a semiconductor device including a transistor, IC, LSI, or surface-mounted, passive components, such as a resistance, capacitor, inductor, oscillator, and filter.

Figure 13B:
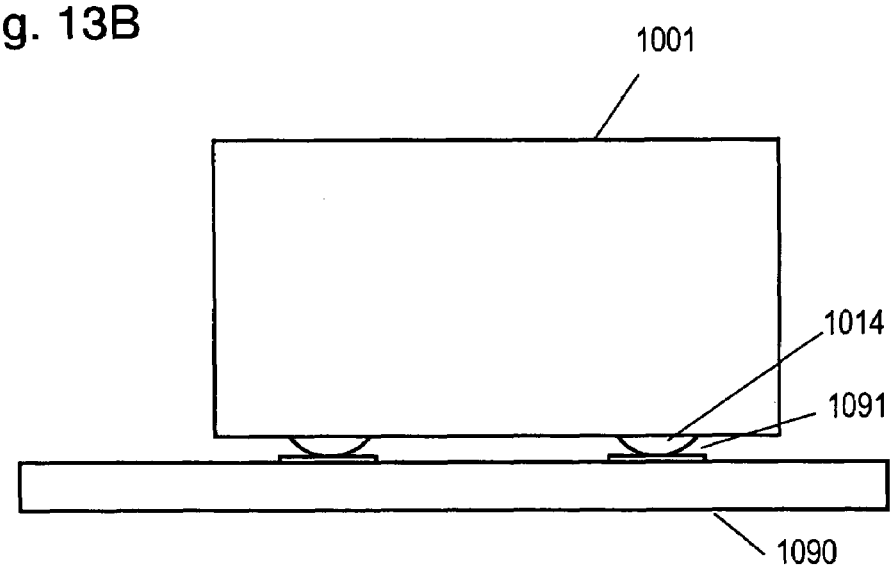
FIG. 13B illustrates the module and a motherboard having the module mounted thereon according to Embodiment 5.

FIG. 13B shows module 1001 and motherboard 1090 having module 1001 mounted thereon. Solder 1014 of module 1001 is connected to electrode 1091 on motherboard 1090. Solder 1005 may be Pb—Sn eutectic solder or Pb-free solder of Sn—Ag—Cu, Au—Sn, or Sn—Zn. These materials has melting points less than 230° C., thus allowing electronic component 1004 not to be heat-resistant. Solder 1005 for mounting electronic component 1004 may be made of material different from or identical to that of solder 1014 for mounting module 1001 on motherboard 1090. Solders 1005 and 1004 may preferably be Pb-free solder for recent environmental issues.

Insulating resin 1007 covers electronic component 1004 completely and enter into a clearance between electronic component 1004 and wiring board 1002. Insulating resin 1007 is made of mixture of inorganic filler and thermosetting resin. The inorganic filler may be substance, such as $Al_2O_3$, MgO, BN, AlN, $SiO_2$, and $BaTiO_3$. The inorganic filler is contained in insulating resin 1007 by a rate a ranging from 50 wt. % to 95 wt. %. This rate allows insulating resin 1007 to form a thickness (for example, 1 mm) beyond the height of electronic component 1004. If the rate is less than 50 wt. %, insulating resin 1007 has a large fluidity, hence being prevented from forming the above-mentioned wall thickness. It is difficult to prepare insulating resin 1007 containing more than 95 wt. % of inorganic filler. The inorganic filler has a particle diameter less than the clearance (L1) between wiring board 1002 and electronic component 1004. The particle diameter allows the clearance between electronic component 1004 and wiring board 1002 to be easily filled with insulating resin 1007. The thermosetting resin contained in insulating resin 1007 may preferably be epoxy resin, phenol resin, or cyanate resin, and may more preferably be epoxy resin for its high heat resistance.

Insulating resin 1007 has a surface having metal film 1015 formed thereon for functioning as an electromagnetic shield. Metal film 1015 may be made of at least one of metallic material, such as Au, Ag, Cu, Ni, Cr, Zn, Ti, Al, and Sn.

As shown in FIGS. 14A and 14B, in module 1001, distance ($S_C$) between electrodes 1006 of electronic component 1004 and distance ($S_S$) between electrodes 1003 of wiring board 1002 satisfy the relation $S_C \geq S_S$. According to the relation, when solder 1005 melts while module 1001 is mounted on the motherboard, a stress caused by a volume expansion due to melting of solder 1005 urging portion part 1007A of insulating resin 1007 between electronic component 1004 and wiring board 1002 toward electronic component 1004. This urging prevents solder 1005 from flow into the clearance between electronic component 1004 and insulating resin 1007, hence preventing short-circuiting between the electrodes due to the melting of solder 1005.

Solder 1005 is formed to have angle α between the bottom surface of electronic component 1004 and contour 1005A at the bottom of electronic component 1004 be an obtuse angle more than 90°. Solder 1005 has angle β between the contour of solder 1005 and electrode 1003 be an acute angle less than 90°. Namely, contours 1005A of solder 1005 extends in directions approaching each other as advancing from electronic component 1004 to wiring board 1002. This structure allows a portion of solder 1005 at the bottom of electronic component 1004 expands so that the portion of solder 1005 urges portion 1007A of insulating resin 1007 between electronic component 1004 and wiring board 1002 toward electronic component 1004. Accordingly, the interface between electronic component 1004 and insulating resin 1007A contacts firmly, hence preventing solder 1005 from flowing out. However, when insulating resin 1007 is hardened, wiring board 1002 and insulating resin 1007 can be firmly bonded to each other since both insulating resin 1007 and wiring board 1002 are made of resin. Therefore, wiring board 1002 and insulating resin 1007 can be bonded firmly against a stress caused by the expansion of solder 1005, hence preventing solder 1005 from flowing into the interface between wiring board 1002 and insulating resin 1007.

It is important that angle α between the bottom surface of electronic component 1004 facing solder 1005 and the contour of solder 1005 does not become an acute angle.

Insulating resin 1007 is made of material having a bending modulus less than 20 GPa to reduce an influence of the expansion of solder 1005.

Exemplary Embodiment 6

Figure 15:
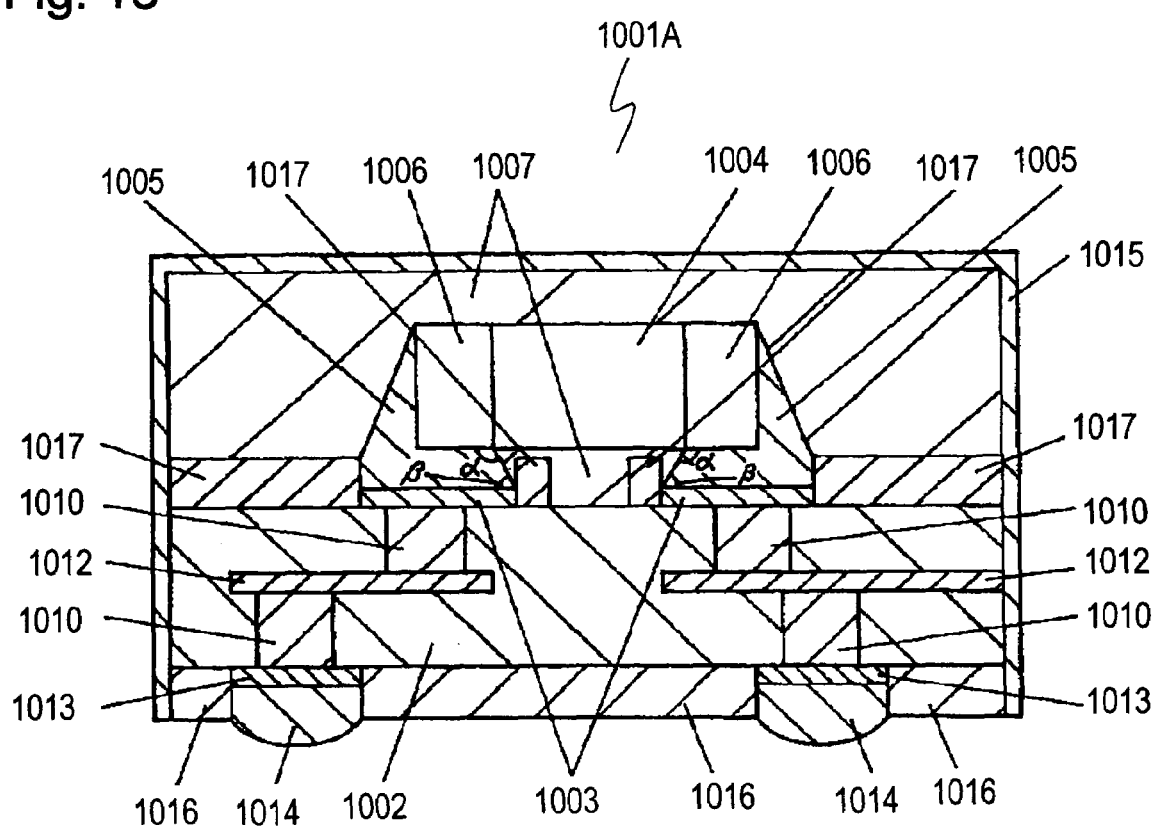
FIG. 15 is a sectional view of the module according to Embodiment 6.

FIG. 15 is a sectional view of module 1001A with built-in electronic component 1006 according to Exemplary Embodiment 6 of the present invention. The same elements as those of Embodiment 5 are denoted by the same reference numerals and are not described in detail.

As shown in FIG. 15, similarly to Embodiment 5, a distance ($S_C$) between electrodes 1006 of electronic component 1004 and a distance ($S_S$) between electrodes 1003 of wiring board 1002 satisfy the relation $S_C \geq S_S$. Angle α between the surface of electronic component 1004 facing solder 1005 and the contour of solder 1005 is not less than 90°. Solder resist 1017 is provided on an upper surface of wiring board 1002. Solder resist 1017 does not provided at a portion on the surface of wiring board 1002 facing electronic component 1004. This arrangement provides a large space between electronic component 1004 and wiring board 1002. This space permits the clearance between electronic component 1004 and wiring board 1002 to be reliably filled with insulating resin 1007.

In the case that angle β between the contour of solder 1005 and the surface of electrode 1003 is an acute angle less than 90°, even when solder 1005 expands and melts, solder resist 1017 functions as a wall for preventing solder 1005 from flowing out.

As described above, solder resist 1017 prevents solder 1005 from flow into the clearance between electronic component 1004 and wiring board 1002 even if solder 1005 melts and expands, hence preventing short-circuiting between electrodes 1003 and 1006.

Exemplary Embodiment 7

Figure 16:
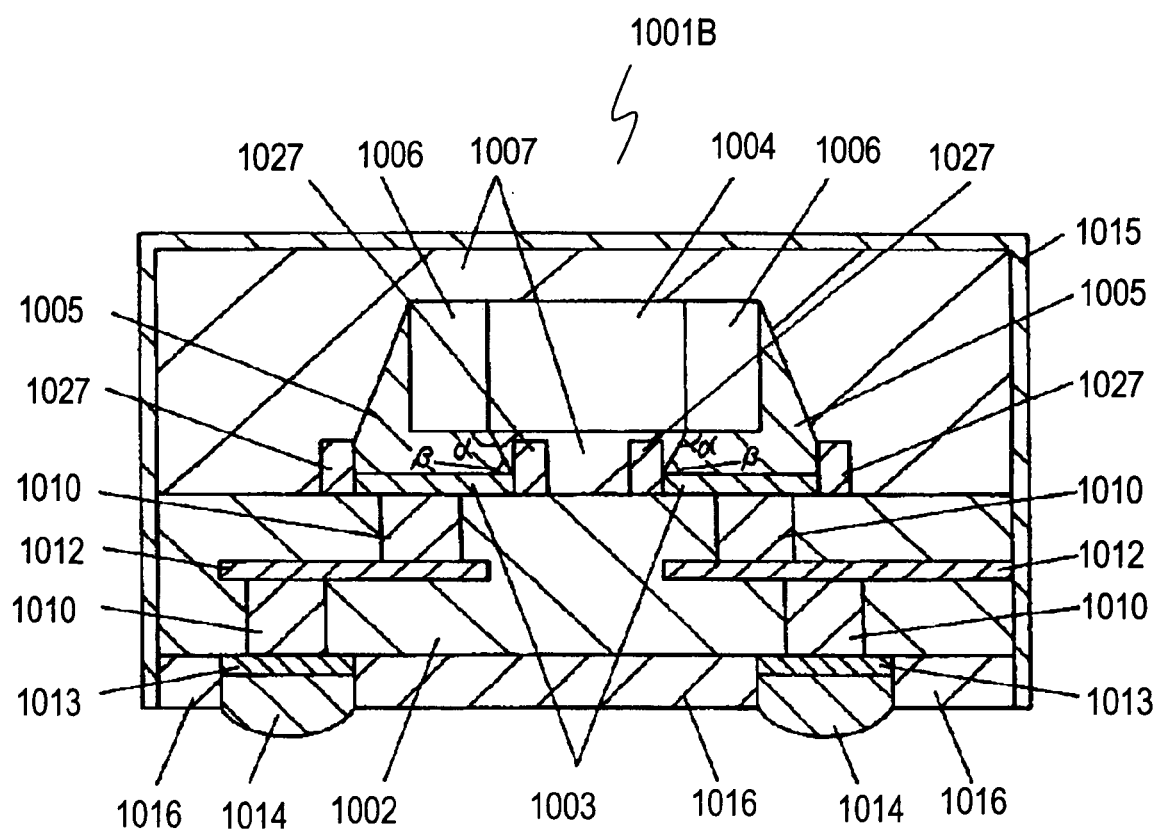
FIG. 16 is a sectional view of the module according to Embodiment 7.
Figure 17:
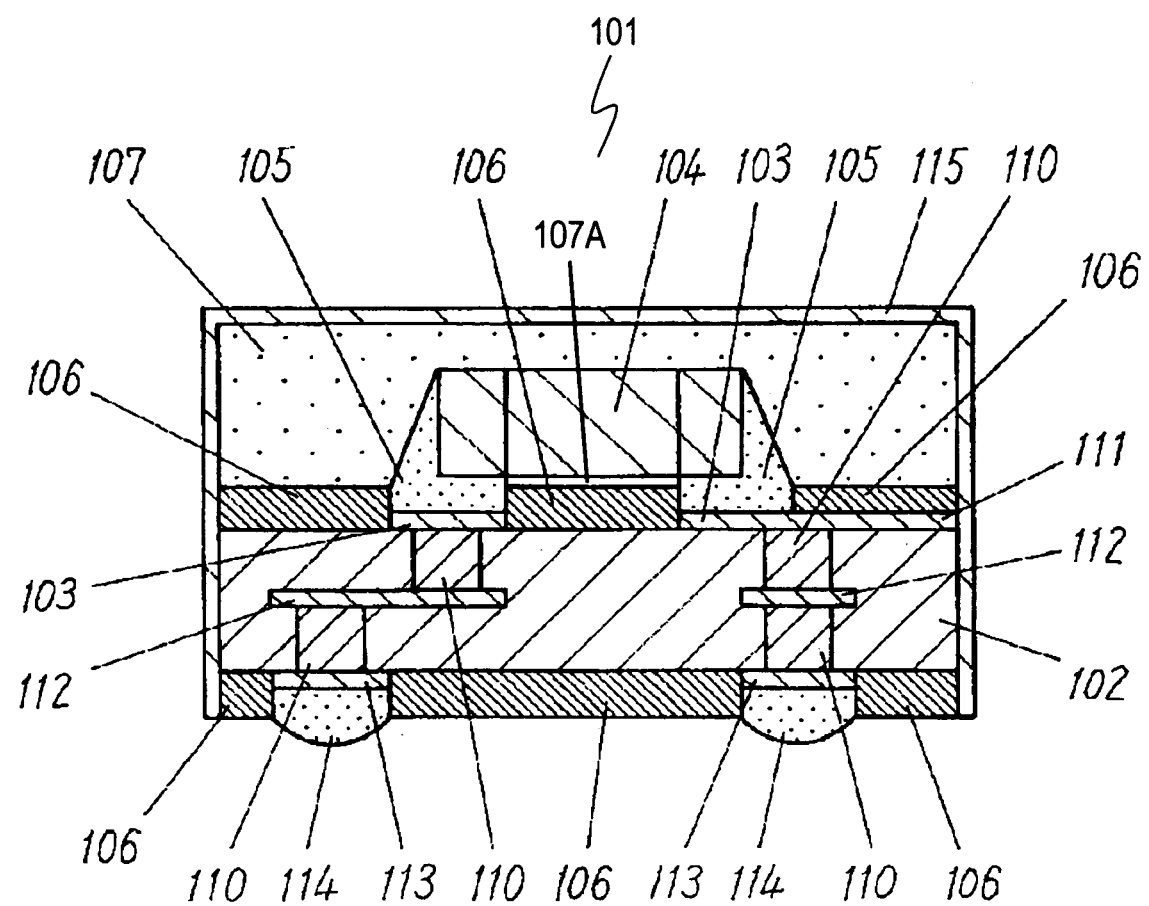
FIG. 17 is a sectional view of a conventional module.
Figure 18:
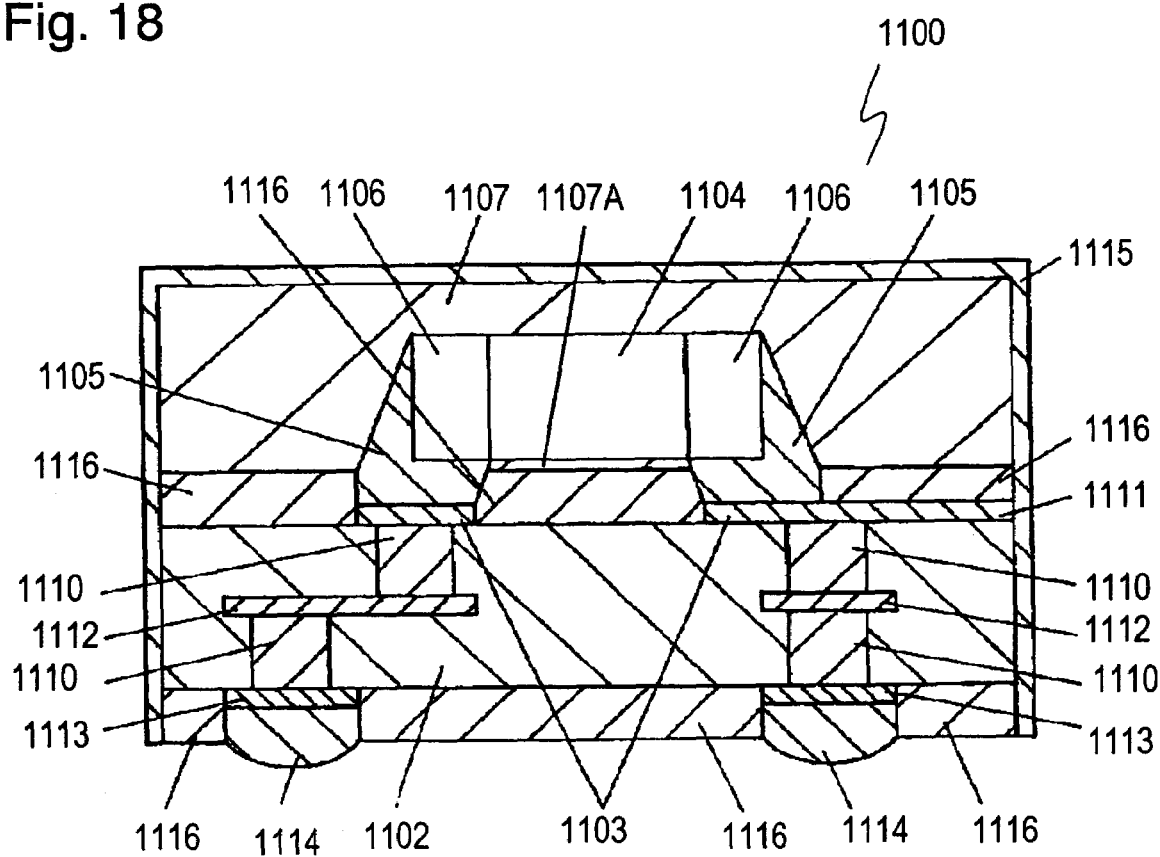
FIG. 18 is a sectional view of another conventional module.

FIG. 16 is a sectional view of module 1001B with built-in electronic component 1004 according to Exemplary Embodiment 7 of the present invention. The same elements as those of Embodiment 5 are denoted by the same reference numerals and are not described in detail.

Similarly to Embodiment 5, in module 1001B, a distance ($S_C$) between electrodes 1006 of electronic component 1004 and a distance ($S_S$) between electrodes 1003 of wiring board 1002 satisfy the relation $S_C \geq S_S$. Angle α between the surface of electronic component 1004 facing wiring board 1002 and the contour of solder 1005 is more than 90°.

Solder resist 27 is formed only around electrode 1003. When electronic component 1004 is mounted on wiring board 1002 with solder 1005, solder resist 27 prevents short-circuiting failure at electrodes 1003 and 1006 due to flowing out of solder 1005. In addition, since solder resist 27 is formed only around electrode 1003, a space between electronic component 1004 and wiring board 1002 can be large. This space allows a clearance between electronic component 1004 and wiring board 1002 to be reliably filled with insulating resin 1007.

Angle β between the surface of electrode 1006 on wiring board 1002 facing to electronic component 4 and the contour of solder 1005 is an acute angle less than 90°. Solder resist 27 functions as a wall for preventing solder 1005 from flowing out even if solder 1005 melts and expands.

As a result, even if solder 1005 melts and expands, solder resist 27 prevents a short-circuiting failure at electrodes 1003 and 1006 due to flowing out of solder 1005 between electronic component 1004 and wiring board 1002.

A shape of solder 1005 in the modules according to Embodiments 5 to 7 may be applied to solder 5 in the modules according to Embodiments 1 to 4 with the same advantages.

INDUSTRIAL APPLICABILITY

In a module with a built-in electronic component according to the present invention, a clearance between the electronic component and a wiring board is reliably filled with an insulating resin. This prevents a melting solder from flowing out of the electrodes when the module is mounted on a motherboard.

What is claimed is:

1. A module comprising:
   a first electronic component including first and second electrodes;
   a board including third and fourth electrodes on a first surface thereof, the third and fourth electrodes being coupled to the first and second electrodes of the first electronic component, respectively;
   first and second solders for connecting the first and second electrodes of the first electronic component to the third and fourth electrodes of the board, respectively;
   a first insulating resin for covering the first electronic component, the first surface of the board, the first and second solders, and the first to fourth electrodes;
   a first solder resist provided on the first surface of the board and around the third electrode; and
   a second solder resist provided on the first surface of the board and around the fourth electrode, the second solder resist being separated from the first solder resist at a portion between the first electronic component and the board.

2. The module as defined in claim 1, wherein the first and second solder resists are provided only around the third and fourth electrodes, respectively.

3. The module as defined in claim 1, wherein the first insulating resin includes
thermosetting resin, and
inorganic filler by a rate ranging from 50 wt. % to 95 wt. % having a particle diameter less than a clearance between the board and the first electronic component.

4. The module as defined in claim 1, wherein the first insulating resin includes
a second insulating resin provided among the first electronic component, the board, and the first and second solders, and
a third insulating resin made of material different from material of the second insulating resin, the first electronic component being located between the third insulating resin and the board.

5. The module as defined in claim 4, wherein the second insulating resin includes
thermosetting resin, and
inorganic filler by a rate ranging from 10 wt. % to 70 wt. % having a particle diameter less than a clearance between the board and the first electronic component.

6. The module as defined in claim 4, wherein the second insulating resin has a bending modulus less than 20 GPa.

7. The module as defined in claim 4, further comprising a metal film for covering a whole surface of the third insulating resin.

8. The module as defined in claim 1, wherein the first insulating resin has a bending modulus less than 20 GPa.

9. The module as defined in claim 1, further comprising:
a second electronic component including fifth and sixth electrodes;
seventh and eighth electrodes coupled to the fifth and sixth electrodes of the second electronic component, respectively, and provided on the first surface of the board;
third and fourth solders for connecting the fifth and sixth electrodes of the second electronic component to the seventh and eighth electrodes of the board, respectively; and
a second insulating resin provided between the second electronic component and the board,
wherein the first resin covers the first and second electronic components, the first surface of the board, the first to fourth solders, and the first to eighth electrodes.

10. The module as defined in claim 9, wherein the first resin includes
a second insulating resin provided between the second component and the board and covering the third and fourth solders, and
a third insulating made of material different from material of the second insulating resin and covering the second insulating resin, the first and second electronic components being located between the third insulating resin and the board.

11. The module as defined in claim 10, further comprising a wall of solder resist on the first surface of the board at an interface between the second insulating resin and the third insulating resin.

12. The module as defined in claim 10, further comprising third and fourth solder resists provided on the first surface of the board and around the seventh and eighth electrodes, respectively.

13. The module as defined in claim 12, wherein the third and fourth solder resists are separated from each other at a portion between the second electronic component and the board.

14. The module as defined in claim 12, wherein the third and fourth solder resists are connected at a portion between the second electronic component and the board.

15. The module as defined in claim 10, wherein the second insulating resin has a thermal expansion coefficient larger than a thermal expansion coefficient of the third insulating resin.

16. The module as defined in claim 9, wherein a distance between the seventh electrode and the eighth electrode is not more than a distance between the fifth electrode and the sixth electrode.

17. The module as defined in claim 1, wherein a distance between the third electrode and the fourth electrode is not more than a distance between the first electrode and the second electrode.

18. The module as defined in claim 1, further comprising a metal film for covering a whole surface of the first insulating resin.

19. A module comprising:
an electronic component including first and second electrodes;
a board including third and fourth electrodes on a first surface thereof, the third and fourth electrodes are coupled to the first and second electrodes of the electronic component, respectively, wherein a distance between the third electrode and the fourth electrode is not more than a distance between the first electrode and the second electrode;
first and second solders for connecting the first and second electrodes of the electronic component to the third and the fourth electrodes, respectively;
an insulating resin for covering the electronic component, the first surface of the board, and the first and second solders;
a first solder resist provided on the first surface of the board and around the third electrode; and
a second solder resist provided on the first surface of the board and around the fourth electrode, the second colder resist being separated from the first solder resist at a portion between the electronic component and the board.

20. The module as defined in claim 19, wherein the first and the second solders have first and second contours located between the electronic component and the board, respectively, and the first and second contours extend in directions approaching each other as the first and second contours approach the wiring board from the electronic component.

21. The module as defined in claim 19, wherein the first and second solder resists are provided only around the third and fourth electrodes, respectively.

22. The module as defined in claim 19, further comprising a fifth electrode electrically connected to the third electrode and provided on a second surface of the board.

23. The module as defined in claim 19, further comprising a metal film for covering a whole surface of the insulating resin.

* * * * *